(12) United States Patent
Araki et al.

(10) Patent No.: US 12,721,164 B2
(45) Date of Patent: Aug. 25, 2026

(54) SEMICONDUCTOR DEVICE HAVING A PLURALITY OF CIRCUIT PATTERNS ON A RESIN INSULATING LAYER

(71) Applicant: Mitsubishi Electric Corporation, Tokyo (JP)

(72) Inventors: Shintaro Araki, Tokyo (JP); Naoki Yoshimatsu, Tokyo (JP); Kazuhiro Nishimura, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 403 days.

(21) Appl. No.: 17/757,407

(22) PCT Filed: Apr. 27, 2020

(86) PCT No.: PCT/JP2020/018004
§ 371 (c)(1),
(2) Date: Jun. 15, 2022

(87) PCT Pub. No.: WO2021/220357
PCT Pub. Date: Nov. 4, 2021

(65) Prior Publication Data
US 2023/0012134 A1 Jan. 12, 2023

(51) Int. Cl.
*H10W 40/25* (2026.01)
*H10W 40/22* (2026.01)
(Continued)

(52) U.S. Cl.
CPC ......... *H10W 40/258* (2026.01); *H10W 40/22* (2026.01); *H10W 70/479* (2026.01);
(Continued)

(58) Field of Classification Search
CPC ............... H01L 23/3736; H01L 23/295; H01L 23/3135; H01L 23/367; H01L 23/49811;
(Continued)

(56) References Cited

U.S. PATENT DOCUMENTS 6,215,176 B1 * 4/2001 Huang ................ H10W 70/481 257/796
8,334,598 B2 * 12/2012 Yoshihara ............... C22C 13/02 257/772

(Continued)

FOREIGN PATENT DOCUMENTS

JP H07-066231 A 3/1995
JP 2000-223634 A 8/2000

(Continued)

OTHER PUBLICATIONS

An Office Action; mailed by the China National Intellectual Property Administration of the People's Republic of China on Sep. 30, 2024, which corresponds to Chinese Patent Application No. 202080100078.4 and is related to U.S. Appl. No. 17/757,407.

(Continued)

*Primary Examiner* — Wael M Fahmy
*Assistant Examiner* — Tirberiu Dan Onuta
(74) *Attorney, Agent, or Firm* — Studebaker Brackett PLLC

(57) ABSTRACT

A semiconductor device includes: a metal block; a semiconductor element fixed to an upper surface of the block with a first joining material; a main terminal fixed to an upper surface of the element with a second joining material; a signal terminal electrically connected to the element; and a mold resin covers the element, the first and second joining materials, a part of the block, of the main and signal terminals. In the element, a current flows in a longitudinal direction. A lower surface of the block is exposed from the resin. The main and the signal terminals are exposed from a side surface of the resin. The main terminal has a first portion in the resin, a second portion continuous with the first portion and bent downward outside the resin, and a third (Continued)

portion continuous with the second portion and substantially parallel to a lower surface of the resin.

12 Claims, 8 Drawing Sheets

(51) Int. Cl.
*H10W 70/40* (2026.01)
*H10W 70/65* (2026.01)
*H10W 70/685* (2026.01)
*H10W 72/00* (2026.01)
*H10W 74/00* (2026.01)
*H10W 74/10* (2026.01)
*H10W 74/40* (2026.01)
*H10W 74/47* (2026.01)
*H10W 90/00* (2026.01)

(52) U.S. Cl.
CPC ....... *H10W 70/658* (2026.01); *H10W 70/685* (2026.01); *H10W 74/121* (2026.01); *H10W 74/473* (2026.01); *H10W 90/701* (2026.01); *H10W 72/865* (2026.01); *H10W 72/884* (2026.01); *H10W 74/00* (2026.01); *H10W 74/40* (2026.01); *H10W 90/736* (2026.01); *H10W 90/755* (2026.01)

(58) Field of Classification Search
CPC ......... H01L 23/49822; H01L 23/49844; H01L 23/49861; H01L 23/3107; H01L 23/49513; H01L 23/3735; H01L 23/9562; H01L 23/49575; H01L 23/4334; H01L 24/32; H01L 24/48; H01L 24/73; H01L 24/40; H01L 24/06; H01L 25/07; H01L 25/18; H01L 2224/32245; H01L 2224/48175; H01L 2224/73215; H01L 2224/73265; H01L 2224/04026; H01L 2224/04042; H01L 2224/40137; H01L 2224/0603; H01L 2224/33181; H01L 2224/48091; H01L 2224/48247; H01L 2924/10254; H01L 2924/10272; H01L 2924/1033; H01L 2924/13055; H01L 2924/182; H01L 2924/186; H01L 2924/30101; H01L 2924/30107; H01L 2924/351; H01L 2924/00014; H01L 2924/181
See application file for complete search history.

(56) References Cited

U.S. PATENT DOCUMENTS

2002/0060356 A1* 5/2002 Nishibori ............. H05K 3/0061 257/737
2003/0020162 A1 1/2003 Koike et al.
2004/0150082 A1 8/2004 Kajiwara et al.
2004/0169289 A1 9/2004 Satou et al.
2006/0108601 A1* 5/2006 Okamoto .............. C23C 28/345 257/178
2010/0133684 A1* 6/2010 Oka .................... H01L 23/3735 438/122
2010/0315786 A1 12/2010 Ochi et al.
2011/0081750 A1 4/2011 Machida
2012/0256194 A1 10/2012 Yoshihara et al.
2013/0082334 A1 4/2013 Nakamura et al.
2017/0025336 A1* 1/2017 Padmanabhan ..... H10W 90/811
2017/0025339 A1* 1/2017 Liu ......................... H01L 24/06
2017/0047265 A1* 2/2017 Hata ..................... H10W 72/30
2022/0037225 A1* 2/2022 Naba ........................ H05K 1/09

FOREIGN PATENT DOCUMENTS

JP 2003-031736 A 1/2003
JP 2004-266096 A 9/2004
JP 2010-287737 A 12/2010
JP 2011-082323 A 4/2011
JP 2012-222000 A 11/2012
JP 2013-074264 A 4/2013
JP 2013-225556 A 10/2013
JP 2018-056479 A 4/2018
JP 2020-009939 A 1/2020
WO 2010/131679 A1 11/2010
WO 2018/061517 A1 4/2018

OTHER PUBLICATIONS

An Office Action; "Notice of Reasons for Refusal," mailed by the Japanese Patent Office on Jan. 31, 2023, which corresponds to Japanese Patent Application No. 2022-518454 and is related to U.S. Appl. No. 17/757,407; with English language translation.
An Office Action; "Notice of Reasons for Refusal," mailed by the Japanese Patent Office on Jul. 11, 2023, which corresponds to Japanese Patent Application No. 2022-518454 and is related to U.S. Appl. No. 17/757,407; with English language translation.
International Search Report issued in PCT/JP2020/018004; mailed Jul. 28, 2020.
Office Action issued in DE 11 2020 007 132.4; mailed by the German Patent and Trademark Office on Jan. 13, 2025.
An Office Action mailed by China National Intellectual Property Administration on Sep. 24, 2025, which corresponds to Chinese Patent Application No. 202080100078.4 and is related to U.S. Appl. No. 17/757,407; with English language translation.
An Office Action; mailed by the China State Intellectual Property Office of People's Republic of China on Jun. 16, 2025, which corresponds to Chinese Patent Application No. 202080100078.4 and is related to U.S. Appl. No. 17/757,407.
An Office Action; mailed by the China State Intellectual Property Office of People's Republic of China on Mar. 14, 2025, which corresponds to Chinese Patent Application No. 202080100078.4 and is related to U.S. Appl. No. 17/757,407.
An Office Action issued by the German Patent and Trademark Office on Apr. 16, 2025, which corresponds to German Patent Application No. 112020007132.4 and is related to U.S. Appl. No. 17/757,407; with English language translation.

* cited by examiner

SEMICONDUCTOR DEVICE HAVING A PLURALITY OF CIRCUIT PATTERNS ON A RESIN INSULATING LAYER

FIELD

The present disclosure relates to a semiconductor device.

BACKGROUND

In a conventional resin-molded semiconductor power device, a main terminal for a main circuit that carries a large current of, for example, 100 A or more and a signal terminal used for inputting a control signal for the main circuit or used for outputting a temperature to a monitor are exposed from the side surfaces of a resin package. The main terminal is connected to an external busbar by screw fastening or welding, and the signal terminal is inserted into a through hole formed in a control board mounted with an integrated circuit (IC) or the like and is connected by soldering. For example, PTL 1 discloses such a semiconductor device.

Most of power semiconductor elements used in electric vehicles and the like have withstand voltages of 600 V or higher, and packages are required to have the same or higher dielectric withstand voltages, so that a creepage distance for maintaining insulation has been necessary between a collector terminal and an emitter terminal and between the collector terminal and a signal terminal.

The back surface of the package is brought into contact with a cooler via heat-dissipating grease to dissipate heat generated from the semiconductor element. Then, a spring has been used to press the package from the upper surface of the package to the cooler side and ensure a constant surface pressure between the package and the cooler, thus enhancing heat dissipation.

CITATION LIST

Patent Literature

[PTL 1] JP 2010-287737A

SUMMARY

Technical Problem

As the generations of the semiconductor elements progress, higher currents and higher withstand voltages have been achieved. However, significant improvement in tracking resistance of resin is not expected because improvement in the tracking resistance of resin may lower other performance, and a reduction in the required creepage distance is also difficult. With a copper material usually used for the main terminal, it is technically difficult to increase a current density while reducing cost. For these reasons, it has been very difficult to reduce the size of the package.

When a ceramic insulating material such as aluminum nitride or silicon carbide or a resin insulating material filled with a filler is used for insulation with the cooler, the insulating material needs to have heat dissipation performance as well as insulation performance. Ceramic has been more suitable as such an insulating material because of its large current and high withstand voltage, but the ceramic has been expensive.

When the package is screwed to the cooler, creep occurs in a portion of the resin-made package having a high surface pressure, and the pressing force decreases. Therefore, by using a holding spring for pressing the upper surface of the package, it is possible to prevent the creep of the resin package that is exposed to a high temperature for a long time. However, the use of the holding spring to press the package against the cooler has drawbacks such as an increase in the number of parts to cause a cost increase and complicated assembling, as compared to the case of screw fastening.

In the busbar connected to the main terminal, in order to reduce inductance, the in and out of current are wired in parallel and close to each other, and insulation is also required. For ensuring insulation between the busbars, ways such as providing resin have been tried. Moreover, since the busbar generates heat when energized, it has been necessary to ensure a large cross-sectional area of the busbar.

The present disclosure is provided to solve the above problems, and it is an object of the present disclosure to provide a semiconductor device suitable for reduction in size and cost.

A semiconductor device according to the present disclosure, includes: a metal block; a semiconductor element that is fixed to an upper surface of the metal block with a first joining material and in which a current flows in a longitudinal direction; a main terminal fixed to an upper surface of the semiconductor element with a second joining material; a signal terminal electrically connected to the semiconductor element; and a mold resin that covers the semiconductor element, the first joining material, and the second joining material, and covers a part of the metal block, a part of the main terminal, and a part of the signal terminal. A lower surface of the metal block is exposed from the mold resin, the main terminal and the signal terminal are each exposed from a side surface of the mold resin, and the main terminal has a first portion in the mold resin, a second portion continuous with the first portion and bent downward outside the mold resin, and a third portion continuous with the second portion and substantially parallel to a lower surface of the mold resin.

Other features of the present disclosure are clarified below.

Advantageous Effects of Invention

According to the present disclosure, the semiconductor device suitable for reduction in size and cost can be provided by directly joining the main electrode or the signal terminal to the circuit pattern.

DESCRIPTION OF EMBODIMENTS

Figure 1:
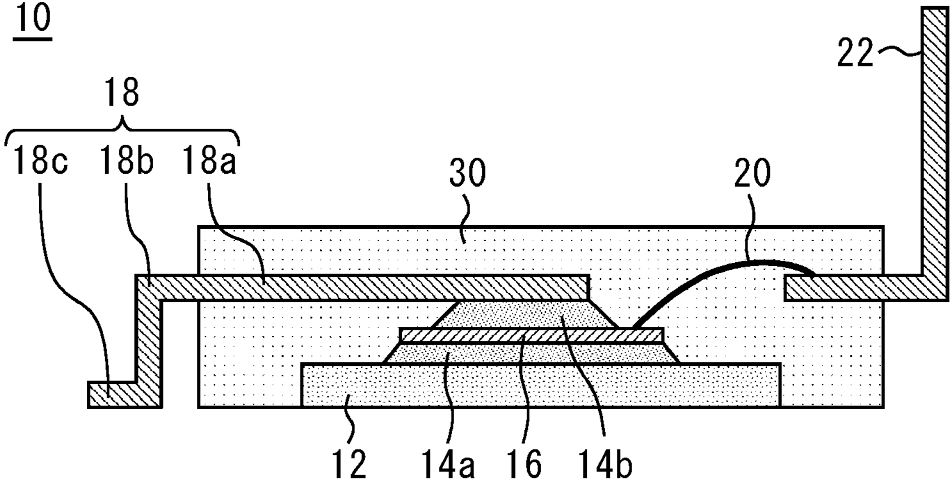
FIG. 1 is a cross-sectional view of a semiconductor device according to a first embodiment.

A semiconductor device according to an embodiment of the present disclosure will be described with reference to the drawings. The same or corresponding components are denoted by the same reference numerals, and the repetition of the description may be omitted.

First Embodiment

FIG. 1 is a cross-sectional view of a semiconductor device 10 according to a first embodiment. The semiconductor device 10 includes a metal block 12. As the metal block 12, a material having high thermal conductivity, low electrical resistivity, and low cost can be adopted. The metal block 12 is formed of, for example, copper or a copper alloy. A semiconductor element 16 is fixed to the upper surface of the metal block 12 with a first joining material 14*a*. The semiconductor element 16 is an element in which a current flows in the longitudinal direction. According to one example, the semiconductor element 16 is an insulated-gate bipolar transistor (IGBT) having a collector on the lower surface and an emitter and a base on the upper surface. A main current flows into the collector and flows out of the emitter. According to another example, the semiconductor element 16 is a metal-oxide-semiconductor field-effect transistor (MOSFET), and the main current flows into the drain and flows out of the source. As the semiconductor element 16, an arbitrary element in which the main current flows in the longitudinal direction can be adopted.

A main terminal 18 is fixed to the upper surface of the semiconductor element 16 with a second joining material 14*b*. A wire 20 made of aluminum or the like is connected to the upper surface of the semiconductor element 16. By the connection of the wire 20 to the signal terminal 22, the signal terminal 22 is electrically connected to the semiconductor element 16.

As the first joining material 14*a*, the second joining material 14*b*, and joining materials to be described later, solder or a brazing material such as silver can be used. For example, by reflow processing of the brazing material, joining using the joining material can be performed. According to one example, the materials of the main terminal 18 and the signal terminal 22 may be copper or a copper alloy.

The above structure is integrally sealed with a mold resin 30. Specifically, the mold resin 30 covers the semiconductor element 16, the first joining material 14*a*, and the second joining material 14*b*, and covers a part of the metal block 12, a part of the main terminal 18, and a part of the signal terminal 22. The lower surface of the metal block 12 is exposed from the mold resin 30. The metal block 12 is exposed only from the lower surface of the mold resin 30. The exposed metal block 12 serves as an energizing path for a collector current.

The main terminal 18 and the signal terminal 22 are exposed from the side surfaces of the mold resin 30. The main terminal 18 has a first portion 18*a* in the mold resin 30, a second portion 18*b* continuous with the first portion 18*a* and bent downward outside the mold resin 30, and a third portion 18*c* continuous with the second portion 18*b* and substantially parallel to the lower surface of the mold resin 30. According to one example, the main terminal 18 is bent downward outside the mold resin 30 and includes the third portion 18*c* that is a flat portion at substantially the same height as the back surface of the mold resin 30. The main terminal 18 provides an energizing path for an emitter current.

According to one example, the signal terminal 22 is bent upward outside the mold resin 30. As a result, the signal terminal 22 has a shape bent upward outside the mold resin 30.

Figure 2:
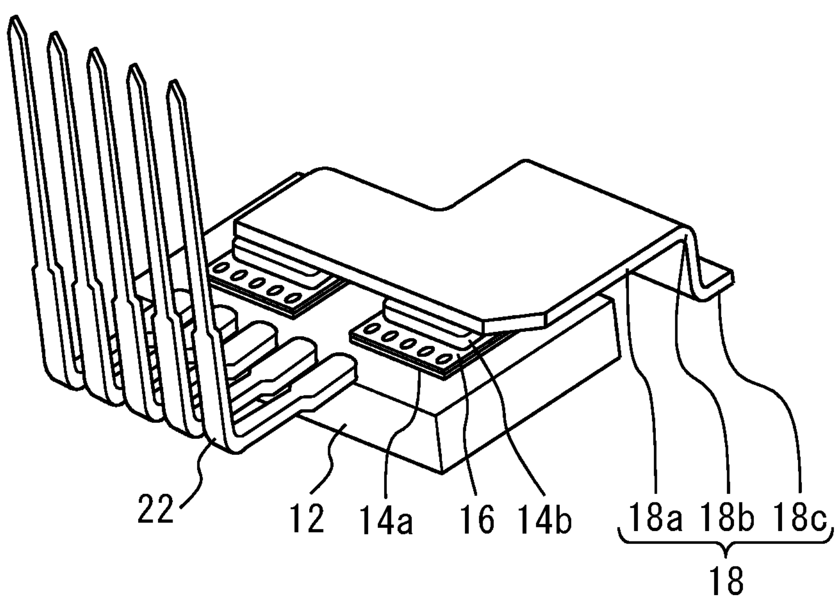
FIG. 2 is a perspective view of the semiconductor device.

FIG. 2 is a perspective view of the semiconductor device before the mold resin 30 is formed. In FIG. 2, the wire 20 of FIG. 1 is omitted. The main terminal 18 is in contact with the emitters of two semiconductor elements 16. FIG. 2 illustrates that the metal block 12 is thicker than the main terminal 18. The material of the metal block 12 is, for example, copper or a copper alloy. The main terminal 18 is a plate-like frame.

Figure 3:
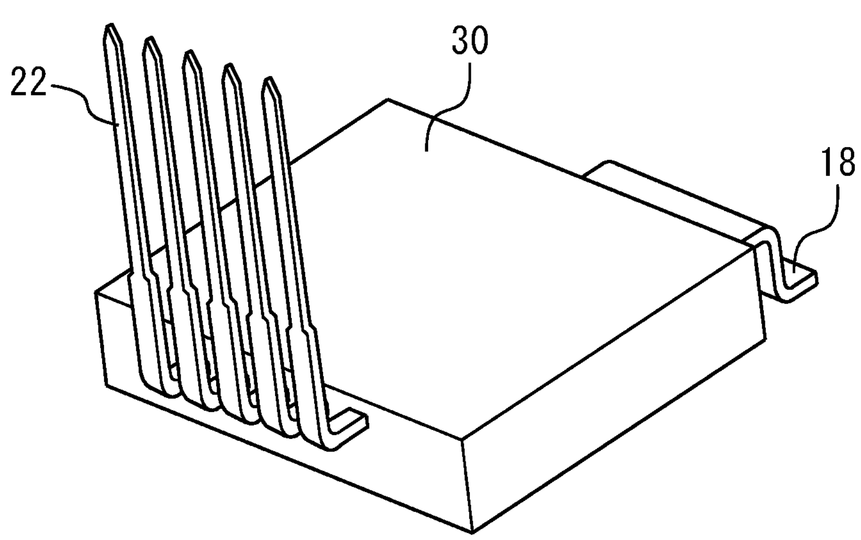
FIG. 3 is a perspective view of the semiconductor device.

FIG. 3 is a perspective view of the semiconductor device 10 of FIG. 1. The main terminal 18 and all the signal terminals 22 are exposed from the side surfaces of the mold resin 30. The semiconductor device 10 described with reference to FIGS. 1 to 3 may be used, for example, for an inverter, which controls a motor of an electric vehicle, electric train, or the like, or for regenerative converter.

In the case of attaching a known resin-sealed semiconductor device to a cooler, a minute gap between the lower surface of the package and the cooler has been filled with heat-dissipating grease to enhance heat dissipation, and a spring or the like has been used to press the resin package against the cooler from the upper surface of the resin package.

In contrast, in the semiconductor device according to the first embodiment, as a result of forming the main terminal 18 into the shape described above, both the main terminal 18 and the metal block 12 can be connected to an insulating substrate by solder or the like. Therefore, the use of the semiconductor device according to the first embodiment eliminates the need for a pressing mechanism such as a spring and facilitates assembly.

Moreover, in the semiconductor device 10 according to the first embodiment, the metal block 12 through which the collector current flows is exposed only from the back surface of the mold resin 30, and the main terminal 18 through which the emitter current flows and the signal terminal 22 for transmitting and receiving signals are exposed only from the side surfaces of the mold resin 30, whereby the insulation distance can be ensured. Therefore, it is possible to reduce the size as compared to a semiconductor element provided with a collector potential frame.

Further, the provision of the metal block 12 reduces unnecessary wiring routing, so that the inductance can be reduced. The metal block 12 can diffuse heat generated from the semiconductor element 16 to efficiently dissipate the heat.

Figure 10:
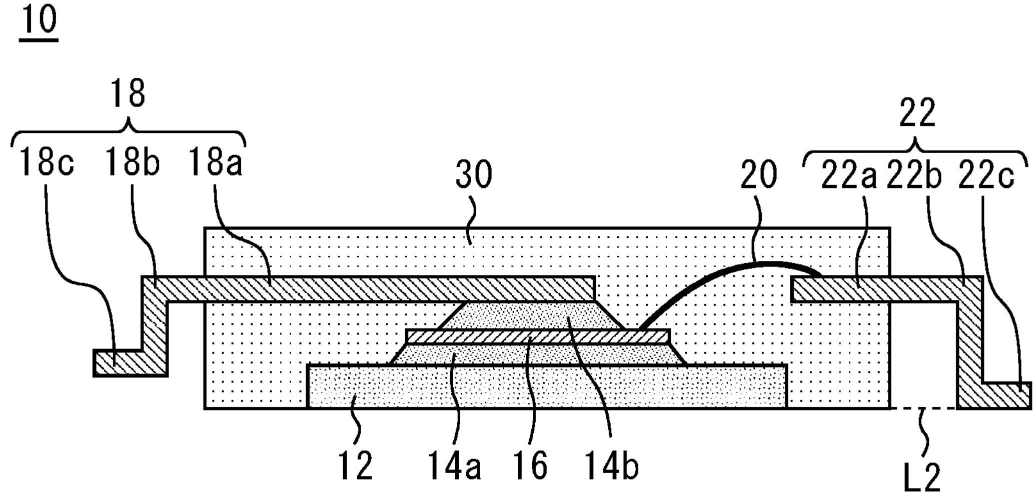
FIG. 10 is a cross-sectional view of a semiconductor device according to a seventh embodiment.

In a case where a die pad DP1 described in JP 2013-074264 A is formed using a frame, in the manufacturing process, a plurality of resin molds are connected by the frame, and hence the frame needs to be cut. Thus, as illustrated in FIG. 10 of JP 2013-074264, the die pad DP1 to serve as a collector potential is exposed on the side surface of the resin package. In this case, the package becomes large in order to ensure the insulation distance between a main terminal to serve as an emitter potential and the die pad DP1 to serve as the collector potential. Moreover, since the die pad DP1 is the frame, it is difficult to ensure a sufficient thickness for improving heat dissipation. In the semiconductor device 10 of the first embodiment, these problems are reduced by exposing the metal block 12 thicker than the main terminal 18 only from the back surface of the mold resin 30, and exposing the main terminal 18 only from the side surface of the mold resin 30.

The modifications, alternations, or alternatives described in the first embodiment can be applied to semiconductor devices according to the following embodiments. The semiconductor devices according to the following embodiments will be described mainly in terms of the difference from the first embodiment.

Second Embodiment

Figure 4:
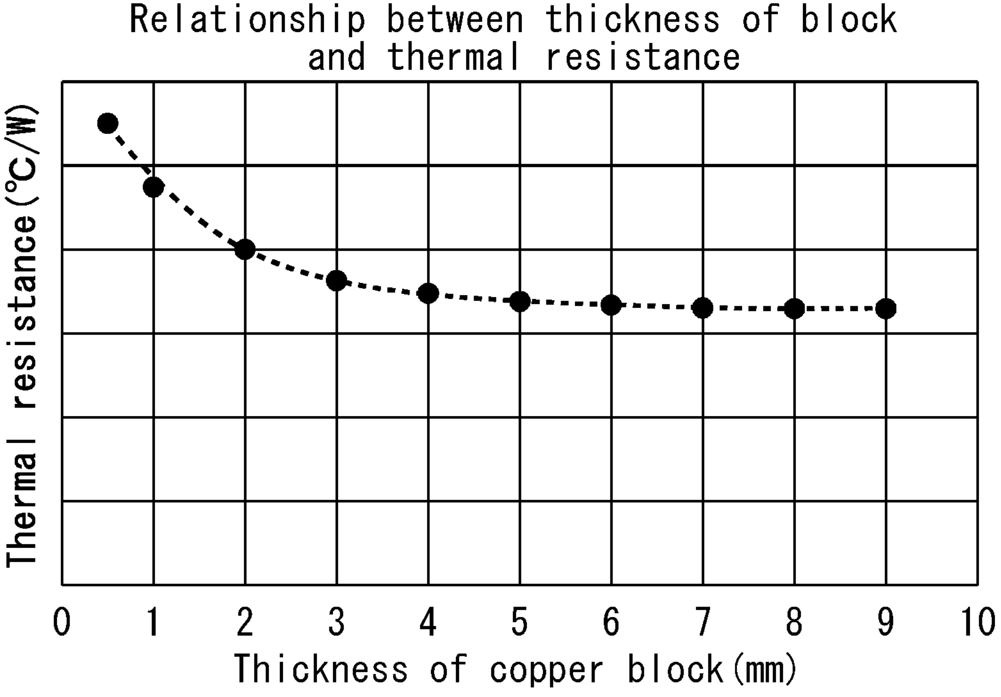
FIG. 4 is a diagram illustrating the relationship between the thickness of the metal block and the thermal resistance.

In a semiconductor device according to a second embodiment, the thickness of the metal block 12 is made equal to or more than twice the thickness of the main terminal 18. FIG. 4 is a diagram illustrating a result of calculating the relationship between the thickness of the metal block 12 and the thermal resistance by the finite element method. In the process of increasing the thickness of the metal block 12 to about 2 mm, a rapid decrease in thermal resistance is observed. When the thickness of the metal block 12 is increased to exceed 2 mm, the value of the thermal resistance saturates gradually. The main terminal 18 may have a thickness of about 1 mm or less in consideration of workability and assembling. When the current is small, the thickness of the main terminal 18 can be reduced, and the thickness of the metal block 12 can also be reduced.

As described above, the thickness of the metal block 12 is correlated with the thermal resistance, and with an increase in the thickness, the effect increases and tends to saturate gradually. Making the thickness of the metal block 12 equal to or more than twice the thickness of the main terminal 18 is effective in reducing the thermal resistance.

Third Embodiment

Figure 5:
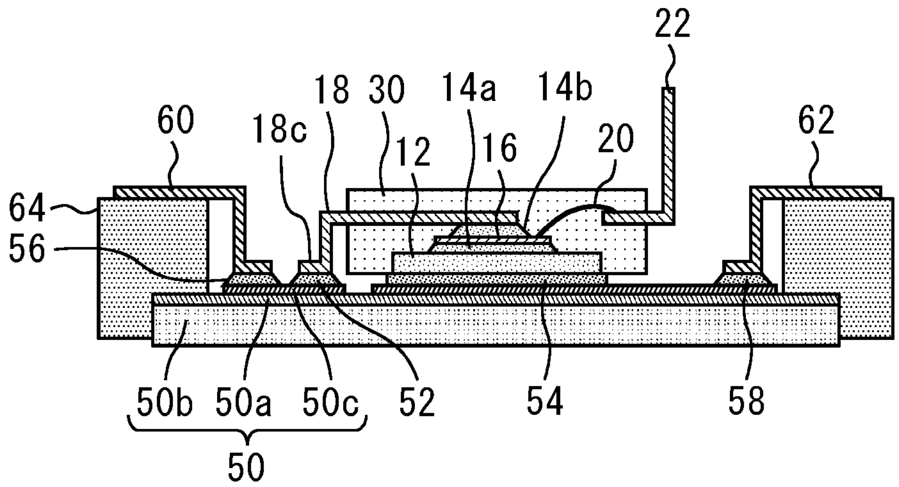
FIG. 5 is a cross-sectional view of a semiconductor device according to a third embodiment.

FIG. 5 is a cross-sectional view of a semiconductor device according to a third embodiment. The semiconductor device includes an insulating substrate 50. The insulating substrate 50 has a metal base 50*b*, an insulating layer 50*a* provided on the metal base 50*b*, and a plurality of circuit patterns 50*c* provided on the insulating layer 50*a*. The main terminal 18 is fixed to a left circuit pattern 50*c* of the plurality of circuit patterns 50*c* with a third joining material 52. The lower surface of the metal block 12 is fixed to a right circuit pattern 50*c* of the plurality of circuit patterns 50*c* with a fourth joining material 54.

An electrode 60 is fixed to the left circuit pattern 50*c* with a joining material 56. An electrode 62 is fixed to the right circuit pattern 50*c* with a joining material 58. A part of each of the electrodes 60, 62 is mounted on an upper surface of a package 64.

Figure 6:
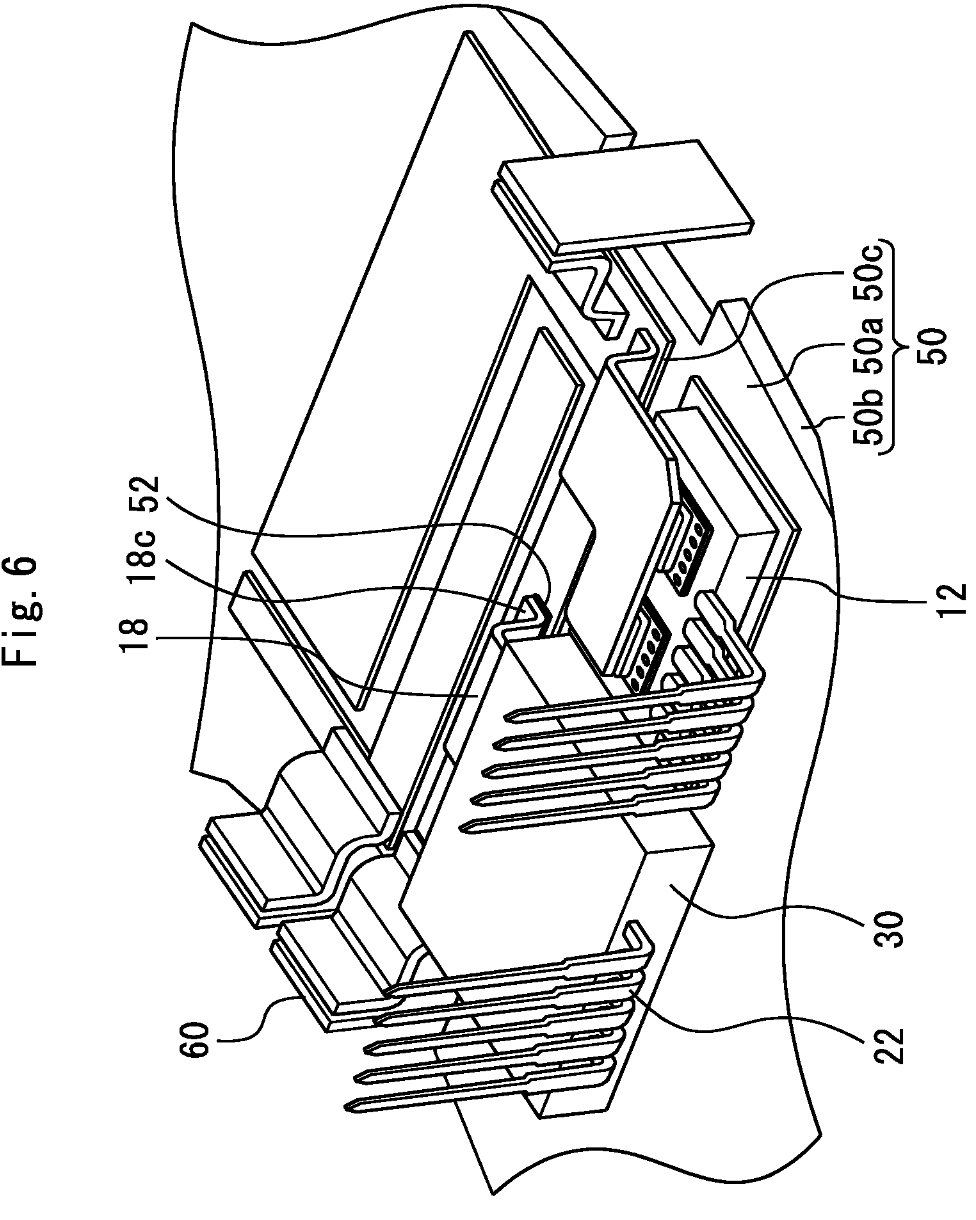
FIG. 6 is a perspective view of the semiconductor device.

FIG. 6 is a view illustrating the inside of the semiconductor device of FIG. 5. For facilitating the understanding, a semiconductor device sealed with the mold resin 30 and a semiconductor device not sealed with the mold resin are illustrated. Both the metal block 12 and the main terminal 18 are joined to the circuit pattern 50*c* of the insulating substrate 50.

The circuit pattern 50*c* can be easily formed by, for example, etching, so that circuit formation and assembly are easier than in the case of busbar wiring. The metal base 50*b* of the insulating substrate 50 promotes cooling of a wiring portion as compared to the busbar wiring. When the wiring portion is cooled, wiring resistance is reduced, so that the cross-sectional area of the wiring portion can be reduced.

In the semiconductor device according to the third embodiment, heat generated from the semiconductor element 16 diffuses to the metal block 12 and is conducted to the metal base 50*b* via the insulating layer 50*a*. The insulating layer 50*a* when the insulating substrate 50 is a resin insulating substrate has a lower thermal conductivity than that of ceramic such as aluminum nitride or silicon nitride, but can also obtain a thermal resistance equivalent to that when a ceramic substrate is used due to the thermal diffusion effect of the metal block 12. In the case of setting the semiconductor device on a cooling fin with grease or the like, it has been necessary to press the semiconductor device with a spring or the like. However, in the case of the developed product, the joining material such as the brazing material is used, and hence peripheral parts such as a spring are not necessary. Since the main circuit is wired using the circuit pattern 50*c* of the insulating substrate 50, and the metal base 50*b* is disposed with the thin insulating layer 50*a* interposed therebetween, the inductance can be reduced.

Fourth Embodiment

Figure 7:
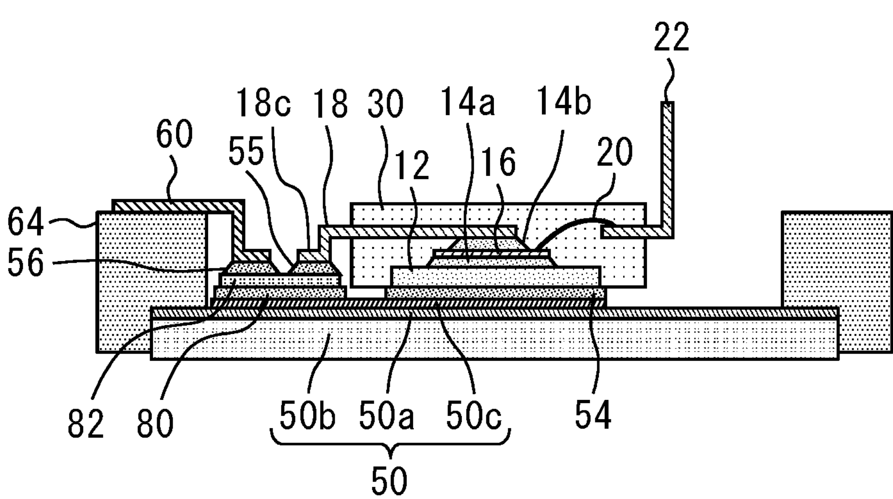
FIG. 7 is a cross-sectional view of a semiconductor device according to a fourth embodiment.

FIG. 7 is a cross-sectional view of a semiconductor device according to a fourth embodiment. As in the third embodiment, the semiconductor device includes an insulating substrate 50 having a metal base 50*b*, an insulating layer 50*a* provided on the metal base 50*b*, and a plurality of circuit patterns 50*c* provided on the insulating layer 50*a*. An auxiliary insulating layer 80 is provided on a partial upper surface of the circuit pattern 50*c*. An auxiliary circuit pattern 82 is provided on the auxiliary insulating layer 80.

The main terminal 18 is fixed to the auxiliary circuit pattern 82 with a fifth joining material 55. The lower surface of the metal block 12 is fixed to the circuit pattern 50*c* with a fourth joining material 54.

As illustrated in FIG. 7, the third portion 18*c* including the flat surface of the main terminal 18 is located above the back surface of the metal block 12. The auxiliary insulating layer 80 and the auxiliary circuit pattern 82 are disposed to be laminated on the circuit pattern 50*c* to which the metal block 12 is joined, and the main terminal 18 is joined to the auxiliary circuit pattern 82. With such a configuration, it is possible to provide the emitter pattern and the collector pattern in parallel while bringing the patterns close to each other, thereby reducing the inductance.

Fifth Embodiment

Figure 8:
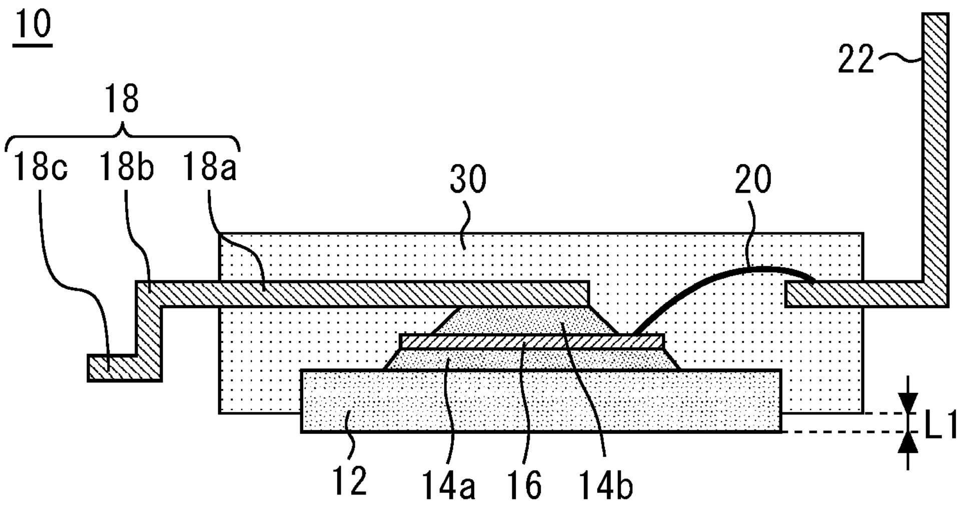
FIG. 8 is a cross-sectional view of a semiconductor device according to a fifth embodiment.

FIG. 8 is a cross-sectional view of a semiconductor device according to a fifth embodiment. The lower surface of the metal block 12 reaches below the lower surface of the mold resin 30. FIG. 8 illustrates that the lower surface of the metal block 12 is located at a distance L1 below the lower surface of the mold resin 30. In other words, the exposed portion of the metal block 12 protrudes from the back surface of the mold resin 30. According to the semiconductor device of the fifth embodiment, the joining material such as a solder fillet can be formed on the side surface of the metal block 12, thus improving the reliability of the joint. The reliability of the joint is, for example, durability under temperature stress.

Sixth Embodiment

Figure 9:
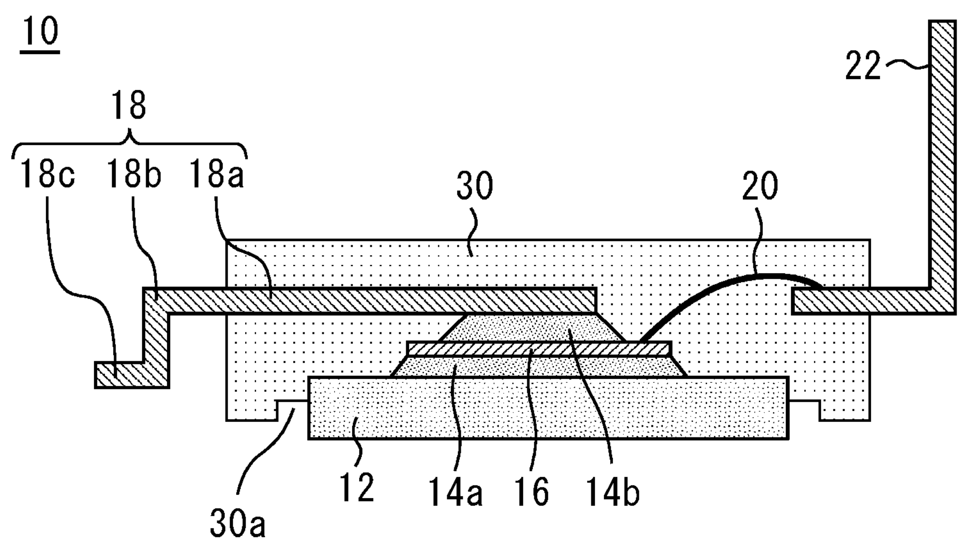
FIG. 9 is a cross-sectional view of a semiconductor device according to a sixth embodiment.

FIG. 9 is a cross-sectional view of a semiconductor device according to a sixth embodiment. On the lower surface of the mold resin 30, a groove 30*a* is provided along the outer edge of the metal block 12. In a bottom view, the groove 30*a* surrounds the exposed portion of the metal block 12, and is provided on the back surface of the mold resin 30. For example, when the joining material under the metal block 12 is thinned in order to lower the thermal resistance of the semiconductor element 16, there is a possibility that excess joining material flows out to cause a short circuit between the circuit patterns. By recovering such excess joining material in the groove 30*a*, the outflow of the excess joining material can be prevented.

Seventh Embodiment

FIG. 10 is a cross-sectional view of a semiconductor device according to a seventh embodiment. A signal terminal 22 has a fourth portion 22*a* in the mold resin 30, a fifth portion 22*b* continuous with the fourth portion 22*a* and bent downward outside the mold resin 30, and a sixth portion 22*c* continuous with the fifth portion 22*b* and substantially parallel to the lower surface of the mold resin 30.

As a result of forming the signal terminal 22 according to the seventh embodiment into the shape described above, the signal terminal 22 can be connected to a circuit pattern, and the circuit pattern can be used as signal wiring. Therefore, for example, at the time of mounting a plurality of semiconductor devices sealed with a mold resin on the same insulating substrate, a plurality of signal terminals can be externally connected by one connector.

In the example of the seventh embodiment, since both the signal terminal 22 and the main terminal 18 are bent downward outside the mold resin 30, the signal terminal 22 and the main terminal 18 can be connected to the insulating substrate.

Figure 11:
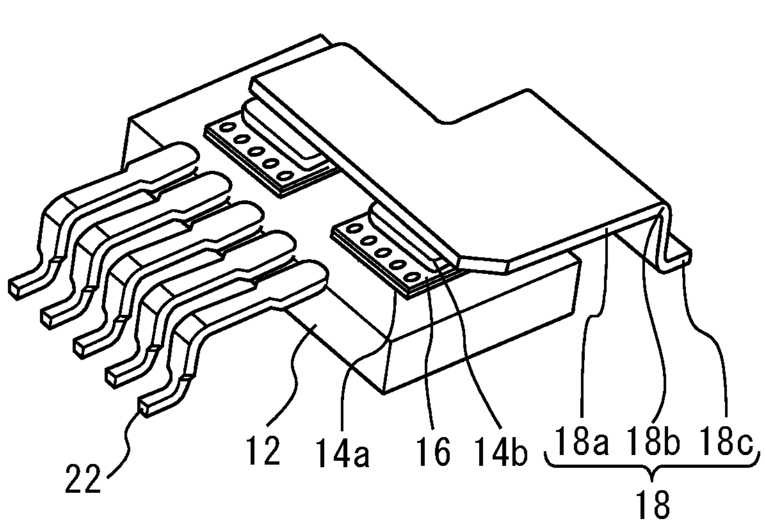
FIG. 11 is a perspective view of the semiconductor device.
Figure 12:
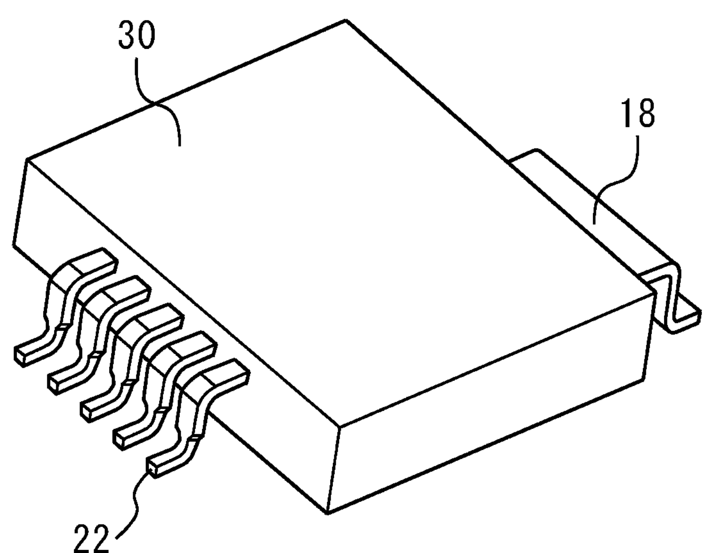
FIG. 12 is a perspective view of the semiconductor device.

FIG. 11 is a perspective view of a semiconductor device before the mold resin is formed. The main terminal 18 and a plurality of signal terminals 22 are provided. The wire 20 is omitted. FIG. 12 is a perspective view of the semiconductor device of FIG. 10. The main terminals 18 and the signal terminals 22 are all exposed to the outside from the side surfaces of the mold resin 30.

Eighth Embodiment

Figure 13:
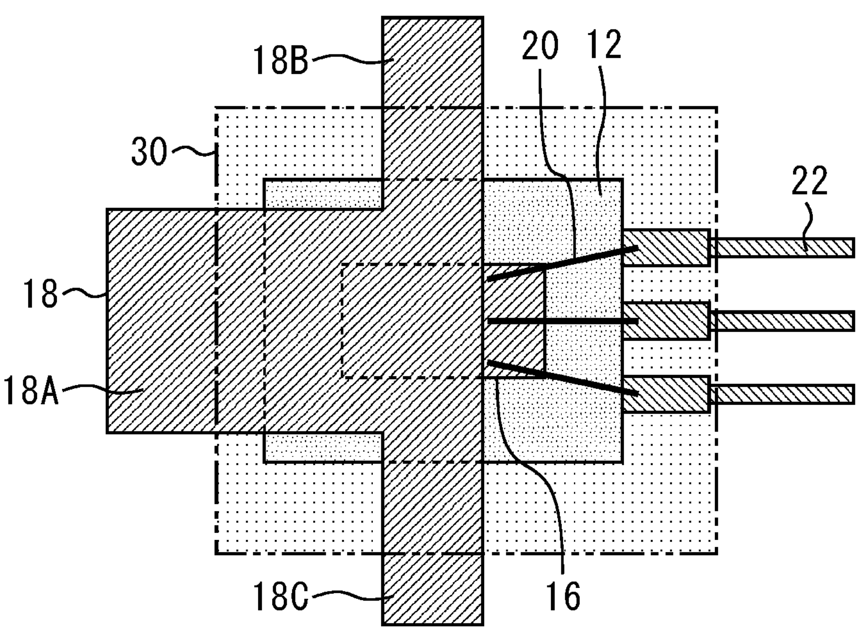
FIG. 13 is a plan view of a semiconductor device according to an eighth embodiment.

FIG. 13 is a plan view of a semiconductor device according to an eighth embodiment. The main terminal 18 is exposed from a plurality of side surfaces of the mold resin 30. In the example of FIG. 13, the main terminal 18 is exposed from the side surfaces of the mold resin 30 in three exposed portions 18A, 18B, 18C. According to another example, two exposed portions may be provided, and the exposed portions may be exposed from two side surfaces of the mold resin. According to still another example, four exposed portions may be provided, and the exposed portions are exposed from the four side surfaces of the mold resin. The plurality of exposed portions of the main terminal 18 may each include the second portion 18*b* and the third portion 18*c* as illustrated in FIG. 1 and the like.

Exposing the main terminals 18 from a plurality of side surfaces of the mold resin 30 improves the degree of freedom in the layout of the circuit pattern of the insulating substrate. Increasing the degree of freedom in the layout of the circuit pattern enables a reduction in the size of the device.

Ninth Embodiment

Figure 14:
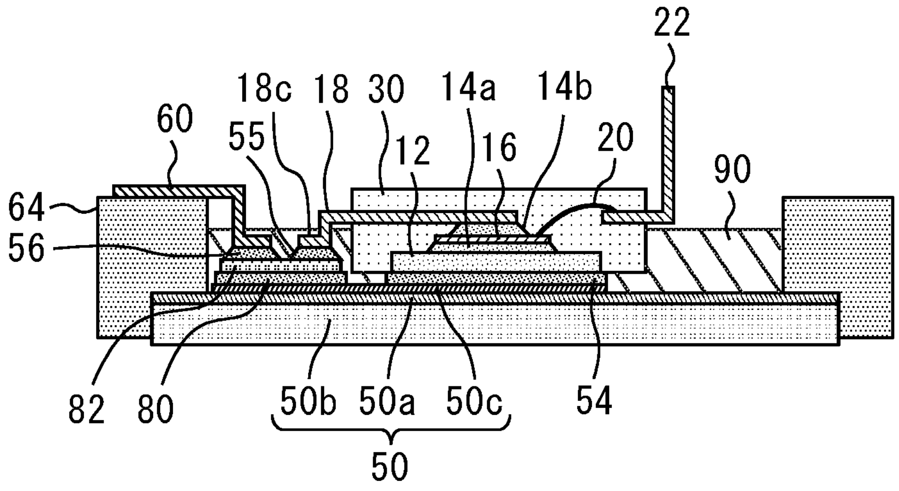
FIG. 14 is a cross-sectional view of a semiconductor device according to a ninth embodiment.

FIG. 14 is a cross-sectional view of a semiconductor device according to a ninth embodiment. A partial surface of the circuit pattern 50*c* is covered with an insulating resin 90. When there are a plurality of circuit patterns 50*c*, partial surfaces of the plurality of circuit patterns 50*c* are covered with the insulating resin 90. When the auxiliary circuit pattern 82 is present, a partial surface of the auxiliary circuit pattern 82 is also covered with the insulating resin 90. The insulating resin 90 is, for example, silicone gel. The insulating resin 90 improves the insulation between the circuit pattern and another circuit pattern, so that the interval between the patterns can be narrowed. Reducing the interval between the patterns enables a reduction in the size of the device.

The semiconductor elements 16 in all the above embodiments may each be formed of a wide-bandgap semiconductor having a larger bandgap than silicon. The wide-bandgap semiconductor is excellent in withstand voltage properties and the like, thus enabling a reduction in the size of the semiconductor device. The wide-bandgap semiconductor includes, for example, silicon carbide, gallium nitride-based materials, or diamond. Particularly, in the present disclosure, the material and thickness of the metal block 12 on which the semiconductor element is mounted are set as described above to improve heat dissipation, so that the area of the semiconductor element formed with a wide bandgap can be reduced. Therefore, it is suitable for cost reduction.

Note that the features of the semiconductor devices according to the above embodiments can be combined.

REFERENCE SIGNS LIST

10 semiconductor device, 12 metal block, 14*a* first joining material, 14*b* second joining material, 16 semiconductor element, 18 main terminal, 18*a* first portion, 18*b* second portion, 18*c* third portion, 20 wire, 22 signal terminal, 30 mold resin

The invention claimed is:

1. A semiconductor device comprising:

a metal block;

a semiconductor element that is fixed to an upper surface of the metal block with a first joining material and in which a current flows in a longitudinal direction;

a main terminal fixed to an upper surface of the semiconductor element with a second joining material;

a signal terminal electrically connected to the semiconductor element;

a mold resin that covers the semiconductor element, the first joining material, and the second joining material, and covers a part of the metal block, a part of the main terminal, and a part of the signal terminal;

an insulating substrate disposed below the metal block, the insulating substrate comprising:

a metal base;

a resin insulating layer provided on the metal base; and a plurality of circuit patterns provided on the resin insulating layer;

a semiconductor package disposed on a first end of the resin insulating layer and a second end of the resin insulating layer;

a first electrode fixed to an upper surface of the semiconductor package disposed on the first end of the resin insulating layer; and a second electrode fixed to an upper surface of the semiconductor package disposed on the second end of the resin insulating layer, wherein a lower surface of the metal block is exposed from the mold resin, the main terminal and the signal terminal are each exposed from a side surface of the mold resin, the main terminal has a first portion in the mold resin, a second portion continuous with the first portion and bent downward outside the mold resin, and a third portion continuous with the second portion and substantially parallel to a lower surface of the mold resin, the main terminal and the first electrode are fixed to a first circuit pattern among the plurality of circuit patterns, and the lower surface of the metal block and the second electrode are fixed to a second circuit pattern among the plurality of circuit patterns.

2. The semiconductor device according to claim 1, wherein the signal terminal has a shape bent upward outside the mold resin.

3. The semiconductor device according to claim 1, wherein the metal block is copper or a copper alloy, and a thickness of the metal block is greater than a thickness of the main terminal.

4. The semiconductor device according to claim 1, wherein the thickness of the metal block is equal to or more than twice the thickness of the main terminal.

5. The semiconductor device according to claim 1, further comprising:

an auxiliary insulating layer provided on a partial upper surface of each circuit pattern of the plurality of circuit patterns; and an auxiliary circuit pattern provided on the auxiliary insulating layer, wherein the main terminal is fixed to the auxiliary circuit pattern with a fifth joining material.

6. The semiconductor device according to claim 1, wherein the lower surface of the metal block reaches below the lower surface of the mold resin.

7. The semiconductor device according to claim 1, wherein the lower surface of the mold resin has a groove along an outer edge of the metal block.

8. The semiconductor device according to claim 1, wherein the main terminal is exposed from a plurality of side surfaces of the mold resin.

9. The semiconductor device according to claim 1, wherein a partial surface of each of the plurality of circuit patterns is covered with an insulating resin.

10. The semiconductor device according to claim 1, wherein the first circuit pattern and the second circuit pattern are formed by etching.

11. The semiconductor device according to claim 1, wherein the semiconductor element is formed of a wide-bandgap semiconductor.

12. The semiconductor device according to claim 11, wherein the wide-bandgap semiconductor is silicon carbide, a gallium nitride-based material, or diamond.

* * * * *